United States Patent [19]

Lin

[11] Patent Number: 5,523,695
[45] Date of Patent: Jun. 4, 1996

[54] UNIVERSAL TEST SOCKET FOR EXPOSING THE ACTIVE SURFACE OF AN INTEGRATED CIRCUIT IN A DIE-DOWN PACKAGE

[75] Inventor: Hao-Chou Lin, San Jose, Calif.

[73] Assignee: VLSI Technology, Inc., San Jose, Calif.

[21] Appl. No.: 296,390

[22] Filed: Aug. 26, 1994

[51] Int. Cl.$^6$ ................................................ G01R 31/02
[52] U.S. Cl. .................... 324/755; 439/493; 439/912
[58] Field of Search ................................ 324/537, 755, 324/408; 439/67, 70, 77, 492, 493, 502, 912; 361/749

[56] References Cited

U.S. PATENT DOCUMENTS

| | | | |
|---|---|---|---|
| 4,420,794 | 12/1983 | Anderson | 439/70 |
| 4,508,403 | 4/1985 | Weltman et al. | 439/912 |
| 4,560,216 | 12/1985 | Egawa | 324/755 |
| 4,924,179 | 5/1990 | Sherman | 324/537 |
| 5,006,792 | 4/1991 | Malhi et al. | 324/158 |

Primary Examiner—Ernest F. Karlsen
Assistant Examiner—Russell M. Kobert
Attorney, Agent, or Firm—Patrick T. King

[57] ABSTRACT

An apparatus and method for placing the die of a die-down configured integrated circuit package in an upright orientation. The first board has electrical receptors peripherally surrounding a first hole formed through the first board. A die-down configured integrated circuit package with the die thereof exposed is inserted into a test socket having a second hole formed through the bottom thereof. The exposed die is located over the second hole in the bottom surface of the test socket. The test socket is placed onto the top surface of the first board. The test socket is positioned on the first board such that the pins of the test socket engage the electrical receptors and such that the exposed die of the die-down configured integrated circuit package is disposed over the first hole. The first board is coupled to a second board having electrical connectors extending from the bottom surface thereof. Each of the electrical connector pins is electrically coupled to a respective electrical receptor on the first board. A flexible connector couples the first and second board together. In one embodiment, the flexible connector also provides electrical coupling of the two boards. Next, the first board is "flipped" or folded over to a position above the second board such that the top surface of the first board opposes the top surface of the second board, and such that the exposed die is visible through the first hole in the first board and the second hole in the test socket. The electrical connecting pins of the second board are then inserted into a standard swap block. In so doing, the present invention provides a socket structure for die-down configured packages which renders the die accessible and which is suitable for use in standard swap block.

5 Claims, 2 Drawing Sheets

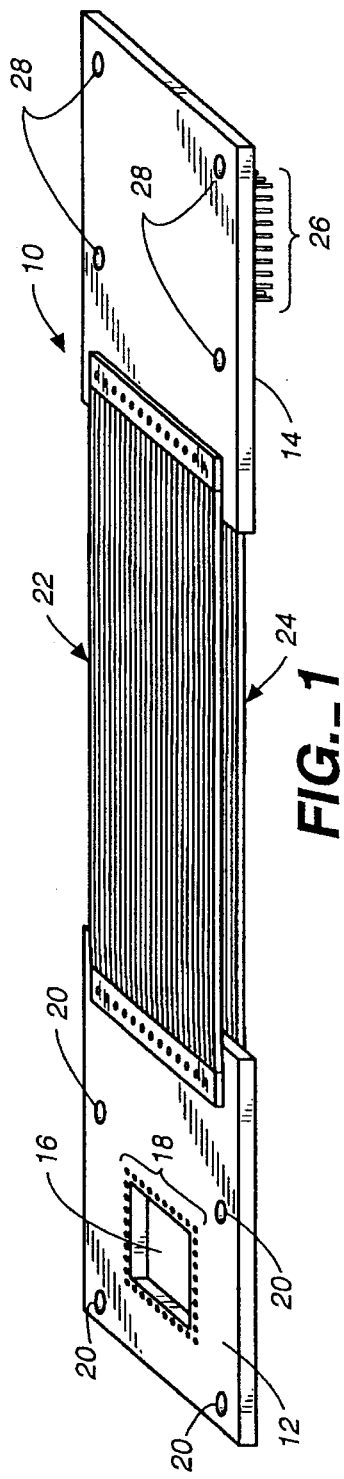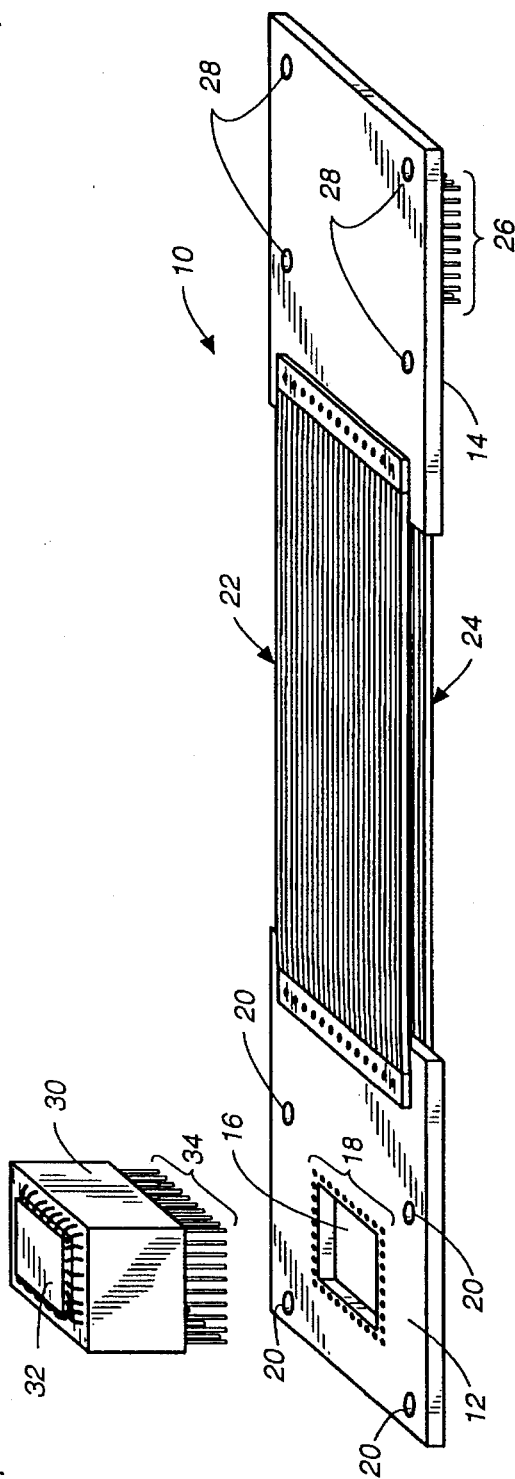

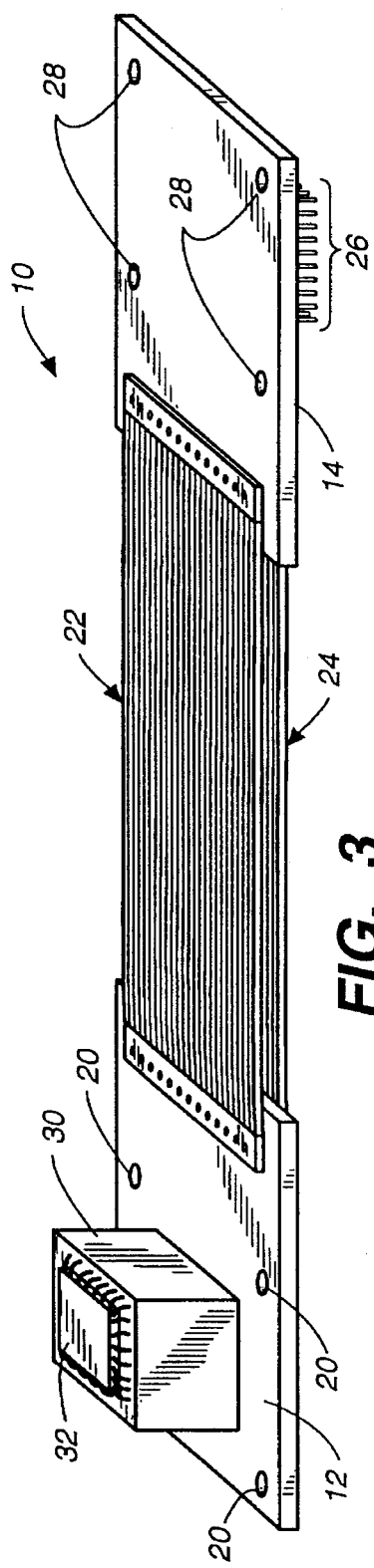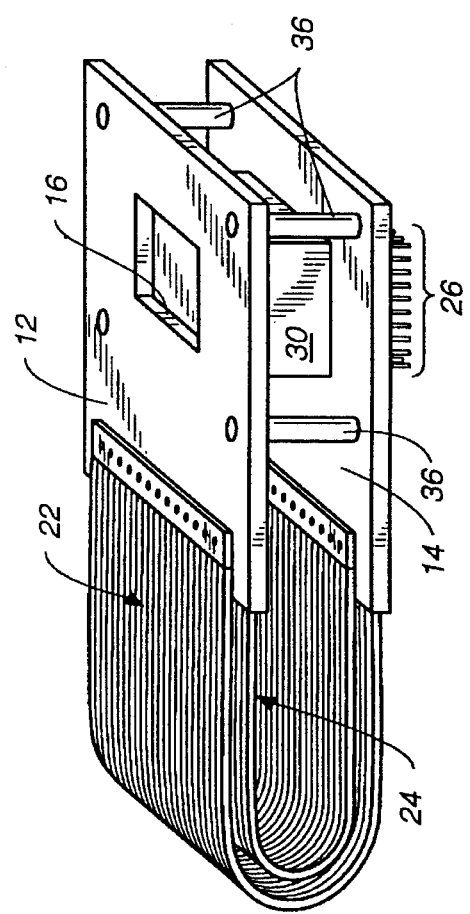

UNIVERSAL TEST SOCKET FOR EXPOSING THE ACTIVE SURFACE OF AN INTEGRATED CIRCUIT IN A DIE-DOWN PACKAGE

BACKGROUND OF THE INVENTION

1. Field of the Invention

The present claimed invention relates to the field of integrated circuit package failure analysis. More specifically, the present claimed invention relates to failure analysis of die-down configured integrated circuit packages.

2. Prior Art

Many integrated circuit package analysis methods such as, for example, LCD Hot Spot Examination, Emission Microscope Light Spot Examination, and Physical Microprobing, require access to the die of the integrated circuit package. Such access is difficult, and often impossible in die-down configured packages. Conventional testing devices require inserting the integrated circuit package into a test socket. In die-down configured packages, the die is then located facing downward near the bottom of the test socket. The test socket is then placed onto a swap block for analysis. Thus, in such cases, the active surface of the die is not readily accessible. That is, the die is facing downward instead of facing upward as desired.

In one attempt to gain access to the active surface of the die, swap block extenders have been employed. Swap block extenders raise the swap block above the universal tester board such that a gap is produced between the bottom surface of the swap block and the top sirface of the universal tester board such that the test socket can be inserted therebetween. However, swap block extensions are extremely difficult to fabricate, and dramatically increase the cost of the analysis process. Furthermore, due to differing electrical connections, each type of integrated circuit die must have a separate swap block.

Consequently, a need exists for a test socket structure which positions the active surface of the die facing upward, which does not require the fabrication of expensive swap block, and which does not require the fabrication of a separate swap block for each type of die, and which is universally suited for numerous types of packaged die-down configured integrated circuits.

SUMMARY OF THE INVENTION

It is therefore an object of the present invention to provide a test socket structure which positions the active surface of the die facing upward, which does not require the fabrication of expensive swap blocks, and which does not require the fabrication of a separate swap block device for each type of die, and which is universally suited for numerous types of packaged die-down configured integrated circuits. The above object has been achieved with an inexpensive test socket structure having two boards interconnected by a flexible connector. In one embodiment, a first board has electrical receptors peripherally surrounding a first hole formed through the first board. A die-down configured integrated circuit package with the die thereof exposed is inserted into a test socket having a second hole formed through the bottom thereof. The exposed die is located over the second hole in the bottom surface of the test socket. The test socket is placed onto the top surface of the first board. The test socket is positioned on the first board such that the pins of the test socket engage the electrical receptors and such that the exposed die of the die-down configured integrated circuit package is disposed over the first hole. The first board is coupled to a second board having electrical connectors extending from the bottom surface thereof. Each of the electrical connector pins is electrically coupled to a respective electrical receptor on the first board. A flexible connector couples the first and second board together. In another embodiment, the flexible connector also provides electrical coupling of the two boards. Next, the first board is "flipped" or folded over to a position above the second board such that the top surface of the first board opposes the top surface of the second board, and such that the exposed die is visible through the first hole in the first board and the second hole in the test socket. The electrical connecting pins of the second board are then inserted into a standard swap block.

In so doing, the present invention provides an inexpensive test socket structure for die-down configured packages which renders the die accessible and which is suitable for use in standard swap block. Additionally, the present invention eliminates the need for swap block extenders, and is suitable for many types of integrated circuit dies.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a perspective view of one embodiment of the test socket structure in accordance with the present claimed invention.

FIG. 2 is a perspective view of one embodiment of the test socket structure of the present invention showing a standard type test socket disposed above the test socket structure in accordance with the present claimed invention.

FIG. 3 is a perspective view of one embodiment of the test socket structure of the present invention having a standard type test socket inserted into the test socket structure in accordance with the present claimed invention.

FIG. 4 is a perspective view of one embodiment of the test socket structure of the present invention having a standard type test socket inserted into the test socket structure and with one board folded over the other board in accordance with the present claimed invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

With reference now to FIG. 1, a perspective view of one embodiment of the test socket structure 10 of the present claimed invention is shown. The following description of the present invention will begin with a detailed description setting forth the mechanical structure of test socket structure 10. This description will then be followed by a detailed description setting forth the operation of the present invention. As shown in FIG. 1, the present invention is comprised of two adjacently positioned boards 12 and 14. In the present embodiment, boards 12 and 14 are formed of printed circuit boards. However, the present invention is also well suited to the use of other types material for boards 12 and 14. Board 12 has a hole 16 formed therethrough. In the present embodiment, hole 16 is at least as large as the active surface of an integrated circuit die. Female type electrical receptors, typically shown as 18, are formed around the periphery of hole 16. Electrical receptors 18 are positioned in a pattern such pins of a standard test socket, not shown, can be inserted into electrical receptors 18. In the present embodiment, board 12 also has indentations 20 formed therein. Indentations 20 are used to hold support columns, not shown.

With reference again to FIG. 1, board 12 is coupled to board 14 by two flexible connectors 22 and 24. Each of flexible connectors 22 and 24 has one end thereof attached to an end of board 12, and the other end attached to one end of board 14. Although two flexible connectors 22 and 24 are used in the present embodiment, the present invention is also well suited to the use of only one flexible connector, or more than two flexible connectors. Board 14 also has pins or electrical connectors, typically shown as 26, extending from the bottom surface thereof. Electrical connectors 26 are positioned in the same pattern as the pins of a standard test socket, not shown. In the present embodiment, board 14 also has indentations 28 formed therein. Indentations 28 are used to hold support columns, not shown.

With reference still to FIG. 1, each electrical receptor 18 is electrically coupled to a respective electrical connector 26. In the present embodiment, conductive traces within board 12 extend from respective electrical receptors 18 to the edge of board 12 to the location where flexible connectors 22 and 24 are attached to board 12. In a similar manner, conductive traces extend from respective electrical connectors 26 to the edge of board 14 to the location where flexible connectors 22 and 24 are attached to board 14. Although the conductive traces are within PC boards 12 and 14 in the present embodiment, the present invention is also well suited to having traces formed in other locations such as, for example, the top surface of boards 12 and 14.

With reference again to FIG. 1, in the present embodiment flexible connectors 22 and 24 are formed of flex cable having electrically conductive traces integrally formed therein. Thus, in the present embodiment, each electrical receptor 18 is electrically coupled to a respective electrical connector 26 via conductive traces in boards 12 and 14, and through the flexible connectors 22 and 24. That is, an electrical path is formed form each electrical receptor 18 to a respective conductive trace on board 12, through flex cable 22 or 24, through a respective conductive trace on board 14 and to an electrical connector 26. In so doing, the present invention provides an electrical connection from each electrical receptor 18 to a respective electrical connector 26. Although flexible connectors 22 and 24 are used to provide electrical connections between each electrical receptor 18 and a respective electrical connector 26, the present invention is also well suited to using other electrical connection means such as, for example, wires. In such instances, flexible connectors 22 and 24 would only serve to physically connect boards 12 and 14.

IN OPERATION

The following is a detailed description of the operation of the present invention. With reference next to FIG. 2, a standard type test socket 30 has a die-down configured integrated circuit package 32 inserted therein. The active surface of the die of die-down integrated circuit package 32 is exposed. The die is exposed by removing any covering material such as, for example, a ceramic or metal lid, or any plastic encapsulant material from the bottom of die-down configured integrated circuit package 32. Standard type test socket 30 also has a hole formed through the bottom surface thereof, such that the active surface of the die is not obstructed by the bottom of test socket 30.

With reference next to FIG. 3, pins 34 of standard type test socket 30 are then inserted into respective electrical receptors 18 of board 12. Since electrical receptors 18 are disposed around the periphery the hole in board 12, the active surface of the die is located over the hole in board 12. Furthermore, since each electrical receptor 18 is electrically coupled to a respective electrical connector 26 via conductive traces in boards 12 and 14, and through the flexible connectors 22 and 24 each pin 34 of standard type test socket 30 is also coupled to a respective electrical connector 26. Thus, each of pins 34 has a respective electrical connector 26 disposed on the bottom surface of board 14.

With reference next to FIG. 4, board 12 is folded over on top of board 14 such that the top surface of board 12 opposes the top surface of board 14. Furthermore, as shown in FIG. 4, in the present embodiment, boards 12 and 14 are parallel and aligned such that the ends of boards 12 and 14 are also aligned. Although such an alignment is set forth in the present embodiment, the present invention is also well suited to having the ends of boards 12 and 14 slightly offset from each other. Additionally, spacer columns 36 are inserted as shown in indentation 20 and 28 to hold board 12 above board 14. In the present embodiment columns 36 are fixedly secured in place using, for example, glue or screws.

With reference again to FIG. 4, by folding board 12 over board 14, the active surface of the die of die-down configured integrated circuit package 32 is oriented facing upward. That is, the active surface of the die is visible through hole 16 and through the hole in the bottom of standard type test socket 30. Thus, a technician or testor can readily achieve access to the active surface of the die for various types of analysis. Furthermore, since electrical connectors 26 of board 14 correspond to the pins of standard type test socket 30, electrical connectors 26 can be inserted into a standard swap block. Therefore, the present invention allows a die-down configured integrated circuit package to be tested on a standard swap block. The present invention also allows such testing to occur while having the active surface of the die oriented facing upward and readily accessible.

The present invention also provides several other substantial advantages over the prior art. The preset invention does not require that the pins of the die-down configured package be removed before testing. The present invention is also inexpensive, and can be used for many types of dies.

Thus, the present invention provides an inexpensive test socket structure for die-down configured packages which renders the die accessible and which is suitable for use in standard swap blocks, and which is universally suited for numerous types of packaged die-down configured integrated circuits. Additionally, the present invention eliminates the need for swap block extenders, and is suitable for many types of integrated circuit dies.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A socket structure for a die-down configured integrated circuit package comprising:

a first board having a top surface and a bottom surface and a first and second end, said first board having a first hole disposed therethrough, said first board having electrical receptors disposed on said top surface at the periphery of said first hole, said electrical receptors positioned to engage pins of a test socket placed on said top surface of said first board, said test socket adapted to receive an integrated circuit package, said test socket having a second hole formed completely therethrough such that an exposed active surface of a die of a die-down configured package is visible through said second hole when said die-down configured package is disposed on said test socket, said first hole positioned such that said die disposed on said test socket is disposed over said first hole when said pins of said test socket engage said electrical receptors, a second board having a top surface and a bottom surface and a first and second end, said first end of said second board disposed adjacent to said first end of said first board, said bottom surface of said second board having electrical connector pins extending therefrom, said electrical connector pins positioned in a standard swap block configuration, each of said electrical connector pins electrically coupled to a respective electrical receptor of said first board, at least one flexible connector having a first end coupled to said first end of said first board and a second end coupled to said first end of said second board, said at least one flexible connector adaptable to having said first board folded over said second board such that said active surface of said die is oriented facing upward and is visible through said first hole in said first board and said second hole of said test socket, and such that said first end of said first board is disposed above said first end of said second board and said second end of said first board is disposed above said second end of said second board, and spacing means for holding said first board above said second board when said first board is folded over said second board.

2. The socket structure of claim 1 wherein said first and second boards are printed circuit boards.

3. The socket structure of claim 1 wherein said at least one flexible connector electrically couples each of said electrical connector pins to a respective electrical receptor.

4. The socket structure of claim 1 wherein spacing means further includes:

means for rigidly securing said first board above said second board.

5. The socket structure of claim 1 further comprising:

first electrical traces extending from respective said electrical receptors to said first end of said first board, and second electrical traces extending from respective said electrical connector pins to said first end of said second board, said at least one flexible connector coupled to said first electrical traces on said first board and said second electrical traces in said second board.

* * * * *